US012293934B2

(12) United States Patent
Steffas et al.

(10) Patent No.: US 12,293,934 B2
(45) Date of Patent: May 6, 2025

(54) USING CONTROLLED GAS PRESSURE FOR BACKSIDE WAFER SUPPORT

(71) Applicant: Applied Materials, Inc., Santa Clara, CA (US)

(72) Inventors: Paul Steffas, Santa Clara, CA (US); Kenneth S. Ledford, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 659 days.

(21) Appl. No.: 17/647,543

(22) Filed: Jan. 10, 2022

(65) Prior Publication Data

US 2022/0223462 A1 Jul. 14, 2022

Related U.S. Application Data

(60) Provisional application No. 63/136,046, filed on Jan. 11, 2021.

(51) Int. Cl.
*H01L 21/683* (2006.01)
*C23C 16/458* (2006.01)
*C23C 16/50* (2006.01)

(52) U.S. Cl.
CPC ...... *H01L 21/6838* (2013.01); *C23C 16/4586* (2013.01); *C23C 16/50* (2013.01)

(58) Field of Classification Search
None
See application file for complete search history.

(56) References Cited

U.S. PATENT DOCUMENTS

2016/0002778 A1* 1/2016 Ravi .................. H01L 21/6838 118/728
2018/0036761 A1 2/2018 Muffler
2020/0373187 A1 11/2020 Singu et al.
2022/0115252 A1* 4/2022 Noji ........................ H01L 22/20

FOREIGN PATENT DOCUMENTS

JP 08-017722 A 1/1996
JP 2005116842 A * 4/2005

OTHER PUBLICATIONS

PCT Written Opinion of the International Searching Authority for International Application No. PCT/US2022/011799; dated Apr. 26, 2022.
Extended European Search Report dated Dec. 18, 2024 for Application No. 22737246.3.

* cited by examiner

*Primary Examiner* — Michael P. Rodriguez
(74) *Attorney, Agent, or Firm* — Patterson + Sheridan, LLP

(57) ABSTRACT

Embodiments described herein provide substrate support assemblies for retaining a surface of a substrate having one or more devices disposed on one or more surfaces of the substrate without contacting the one or more devices and preventing changes in profile of the substrate. The substrate support assembly allows for control of the substrate. The substrate support assembly includes a gas nozzle disposed through a body of the substrate support assembly. The gas nozzle provides a gas to the substrate. The gas is operable to provide pressure to the substrate to reduce contact on the substrate and to control the profile of the substrate.

20 Claims, 6 Drawing Sheets

100
101
212
210
103
118
122
105
106
216
202
111
404
108
113
120
114
112

USING CONTROLLED GAS PRESSURE FOR BACKSIDE WAFER SUPPORT

CROSS-REFERENCE TO RELATED APPLICATIONS

This Application claims the benefit of pending U.S. Provisional Patent Application No. 63/136,046, filed Jan. 11, 2021, the contents of which are incorporated herein in their entirety.

BACKGROUND

Field

Embodiments of the present disclosure generally relate to substrate support assemblies. More specifically, embodiments of the present disclosure relate to substrate support assemblies for retaining a surface of a substrate and controlling a profile of the substrate.

Description of the Related Art

In the manufacture of optical devices, one or more devices having structures with sub-micron critical dimensions are disposed on two or more sides of a substrate, such as a front side and a backside of the substrate. To manufacture optical devices, such as waveguide combiners, a surface of the substrate having the one or more devices disposed on the surface must be retained on a substrate support assembly without contacting the one or more devices. Contacting the one or more devices may damage the devices. Furthermore, the substrate may include fragile materials, such as glass, and may have a thickness less than about 1 millimeter (mm). The combination of the fragile materials and the thickness may result in profile changes of the substrate, such as sagging of the substrate. Accordingly, what is needed in the art is substrate support assemblies which allow for profile control of the substrate and reduced contact on surfaces of the substrate.

SUMMARY

In one embodiment, a substrate support assembly is provided. The substrate support assembly includes a lower plate and an upper plate coupled to the lower plate. The upper plate is disposed on a top surface of the lower plate. The upper plate includes an upper surface and a retention surface disposed below the upper surface. The upper plate further includes a lip formed between the upper surface and the retention surface. The upper plate further includes a plurality of vacuum slots disposed through the retention surface. The substrate support assembly further includes at least two arcuate extensions disposed at a perimeter of the lower plate and the lower plate. The extensions are operable to move into a raised position and a lowered position. The substrate support assembly further includes a gas nozzle disposed through the upper plate.

In another embodiment, a substrate support assembly is provided. The substrate support assembly includes a lower plate and an upper plate coupled to the lower plate. The upper plate is disposed on a top surface of the lower plate. The upper plate includes an upper surface and a retention surface disposed below the upper surface. The upper plate further includes a lip formed between the upper surface and the retention surface. The upper plate further includes a plurality of vacuum slots disposed through the retention surface. The substrate support assembly further includes at least two extensions disposed at a perimeter of the lower plate and the lower plate. The extensions are operable to move into a raised position and a lowered position. The substrate support assembly further includes a gas nozzle disposed through the upper plate. The gas nozzle includes a top surface of the gas nozzle disposed below the substrate and the retention surface In yet another embodiment, a method is provided. The method includes positioning a substrate onto at least two extensions disposed in a raised position of a substrate support assembly. The extensions are coupled to a body of the substrate support assembly. The method further includes lowering the extensions to a lowered positon. The lowered position includes the substrate sitting on a retention surface of the body. The retention surface includes a plurality of vacuum slots disposed therethrough. The method further includes providing a gas to active areas of the substrate through a gas nozzle disposed through the body of the substrate support assembly. The gas nozzle provides the gas at a direction perpendicular to a surface of the substrate. The method further includes providing a vacuum pressure to an exclusion zone of the substrate. The vacuum pressure is provided through the plurality of vacuum slots.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to substrate support assemblies. More specifically, embodiments of the present disclosure relate to substrate support assemblies for retaining a surface of a substrate and controlling a profile of the substrate. In one embodiment, a substrate support assembly is provided. The substrate support assembly includes a lower plate and an upper plate coupled to the lower plate. The upper plate is disposed on a top surface of the lower plate. The upper plate includes an upper surface and a retention surface. The upper surface and the retention surface meet to form a lip therebetween. The upper plate further includes a plurality of vacuum slots disposed through the upper plate. The substrate support assembly further includes at least two extensions coupled to the lower plate and the upper plate. The extensions are operable to move into a raised position and a lowered position. The substrate support assembly further includes a gas nozzle disposed through the upper plate. In another embodiment, a method is provided. The method includes positioning a substrate onto at least two extensions disposed in a raised position of a substrate support assembly. The extensions are coupled to a body of the substrate support assembly. The method further includes lowering the extensions to a lowered positon. The lowered position includes the substrate sitting on a retention surface of the body. The retention surface includes a plurality of vacuum slots disposed therethrough. The method further includes providing a gas to active areas of the substrate through a gas nozzle disposed through the body of the substrate support assembly. The gas nozzle provides the gas at a direction perpendicular to a surface of the substrate. The method further includes providing a vacuum pressure to an exclusion zone of the substrate. The vacuum pressure is provided through the plurality of vacuum slots.

Figure 1:
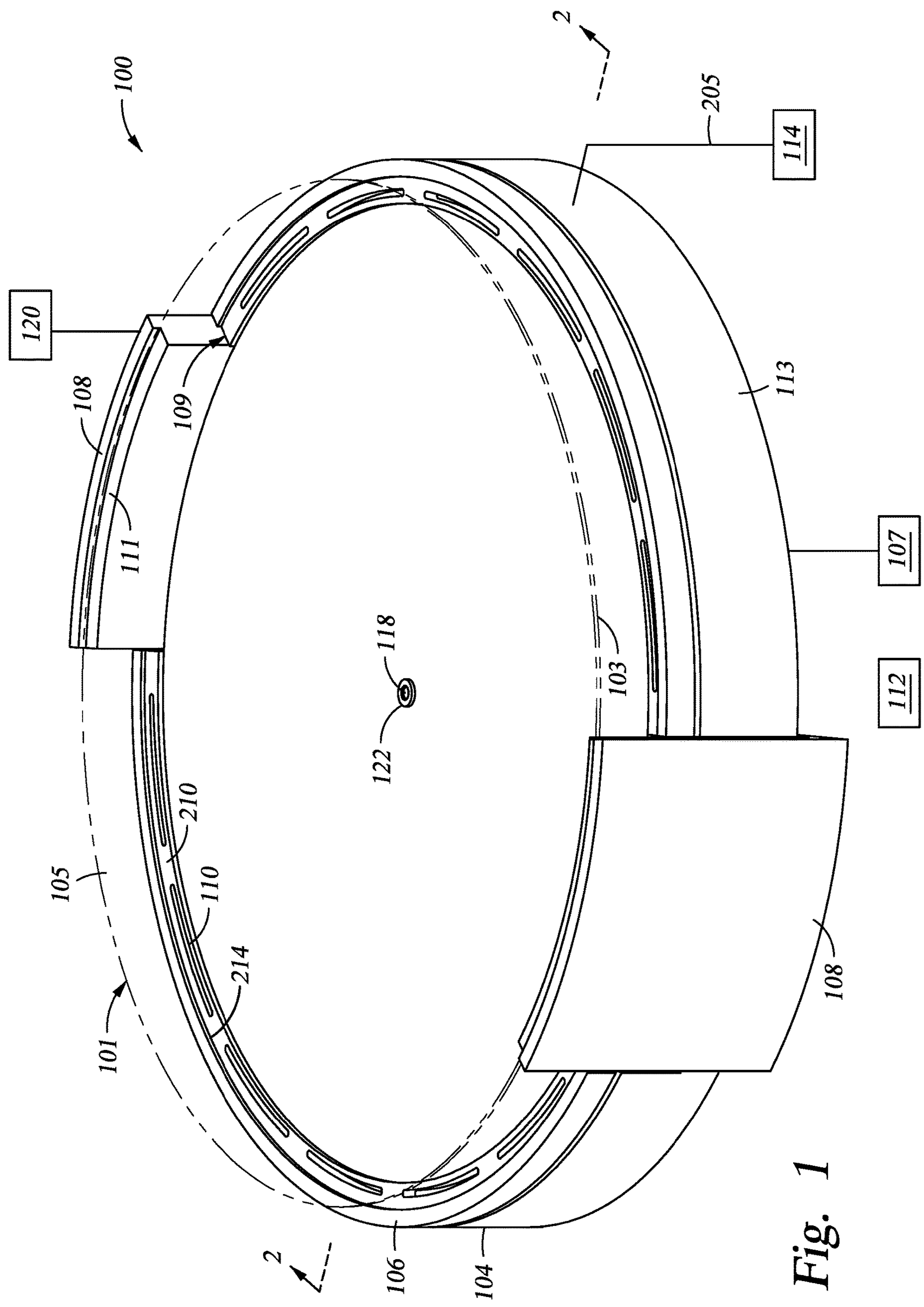
FIG. 1 is a schematic, isometric view of a substrate support assembly in a raised position according to embodiments.

FIG. 1 is a schematic, isometric view of a substrate support assembly 100 in a raised position. The substrate support assembly 100 may be used with or modified to be used with different systems. For example, the substrate support assembly 100 may be utilized in chemical vapor deposition (CVD) systems, plasma-enhanced CVD (PECVD) systems, nano-imprint lithography systems, spin-on coating systems, angled etch systems, ink-jet systems, among others, as well as other systems utilized in manufacturing optical devices.

Figure 2:
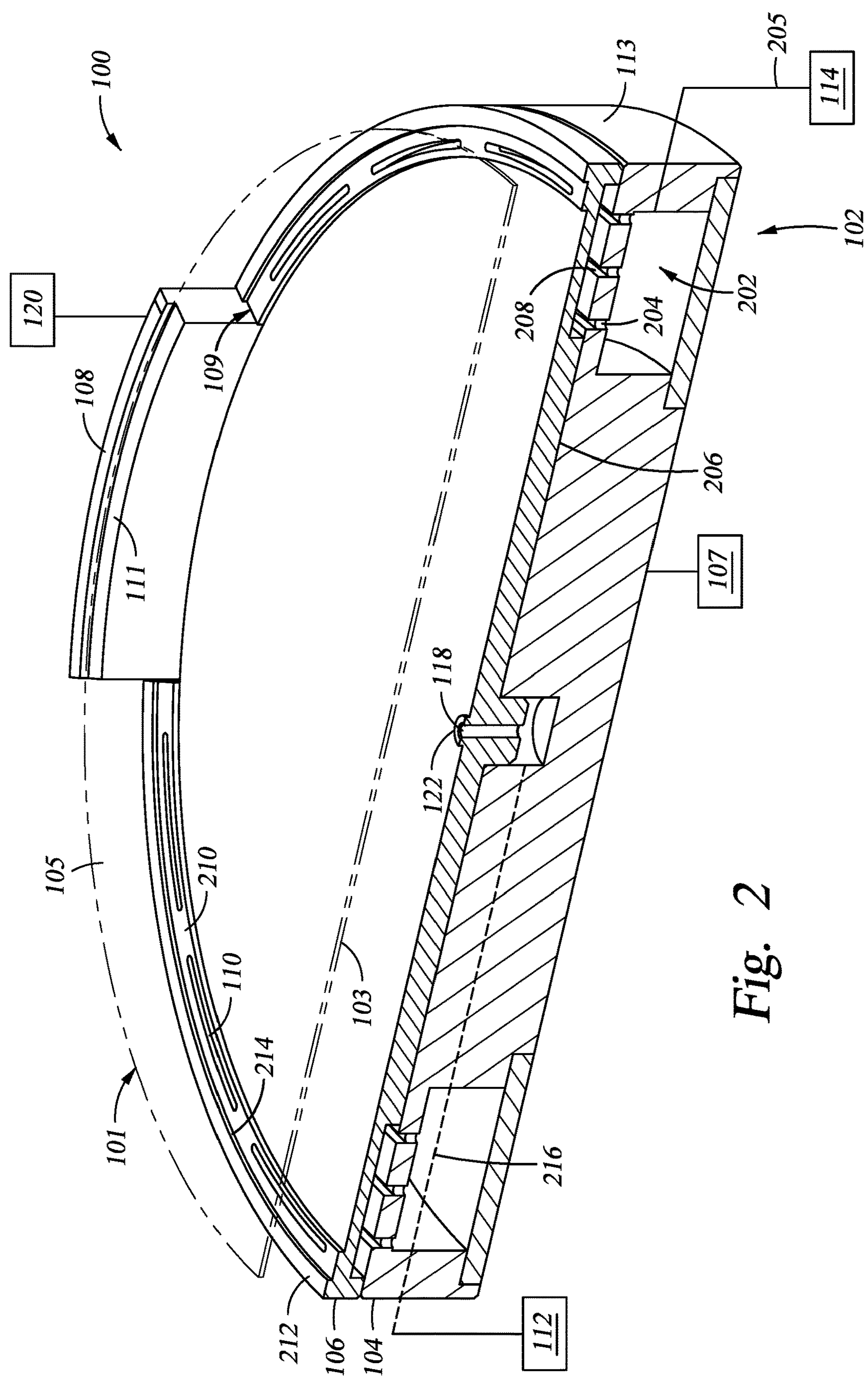
FIG. 2 is a schematic, cross-sectional view of a substrate support assembly in a raised position according to embodiments.

The substrate support assembly 100 is operable to retain a substrate 101. The substrate 101 includes a second surface 103 (i.e., bottom surface) opposite a first surface 105. In one embodiment, which can be combined with other embodiments described herein, the first surface 105 is a backside of the substrate 101. In another embodiment, which can be combined with other embodiments described herein, the second surface 103 is a backside of the substrate 101 (as shown in FIG. 1 and FIG. 2). The substrate 101 may be glass, plastic, and polycarbonate, or any other suitable material. The substrate materials may have rollable and flexible properties. In one embodiment, which can be combined with other embodiments described herein, the substrate 101 has a thickness less than about 1 millimeter (mm). In some embodiments, the thickness is less than or equal to about 0.3 mm.

The substrate 101 is an optical device substrate. The substrate 101 includes one or more optical devices, such as waveguide combiners, disposed on the first surface 105 and/or the second surface 103 of the substrate 101. The optical devices include structures having sub-micron critical dimensions, e.g., nano-sized critical dimensions. The optical devices are disposed on active areas of the substrate 101. Touching, handling, and contacting the active areas of the substrate 101 can damage the one or more optical devices. The active zones also correspond to areas of the substrate 101 to be patterned with the optical devices. The substrate 101 further includes an exclusion zone. The exclusion zone does not include the one or more optical devices. In some embodiments, the exclusion zone is disposed along and around the perimeter of the substrate 101. Supporting the exclusion zone allows for optical devices disposed on the first surface 105 and/or the second surface 103 of the substrate 101 to not be contacted. The active zones are interior to the exclusion zones.

Therefore, the substrate support assembly 100 can retain the substrate 101 by contacting and supporting the exclusion zone of the substrate 101 without contacting the active zones. Additionally, the substrate support assembly 100 is operable to control a profile of the substrate 101, such as by compensating for sagging with pressurized gas as described by the method 300. The substrate support assembly 100 is operable to control the profile of the substrate 101. For example, the substrate support assembly 100 is operable to control the profile of the substrate 101 such that the substrate 101 is substantially planar, within +/−0.1 mm.

The substrate support assembly 100 includes a body 102 and at least two extensions 108. In one embodiment, which can be combined with other embodiments described herein, the body 102 is substantially circular in shape. The body 102 is not limited in shape and may support different shaped substrates. The extensions 108 are coupled to the body 102 and extend through apertures 109 in the body 102. The extensions 108 are operable to move from a raised position (shown in FIGS. 4A and 4B) and a lowered position (shown in FIG. 4C). An actuator 120 is coupled to the extensions 108. The actuator 120 is a mechanical actuator. The actuator 120 is operable to raise and lower the extensions 108 between the lowered position and the raised position. The extensions 108 are arcuate in shape. Each extension 108 has an angular range around the body 102. The angular range is between about 10° and about 135°. More specifically, the angular range is between about 10° and about 135°, about 10° and about 100°, about 10° and about 90°, about 10° and about 80°, about 10° and about 70°, about 10° and about 60°, about 10° and about 50°, about 10° and about 40°, about 15° and about 90°, about 15° and about 45°, about 20° and about 90°, or about 20° and about 45°.

Figure 4A:
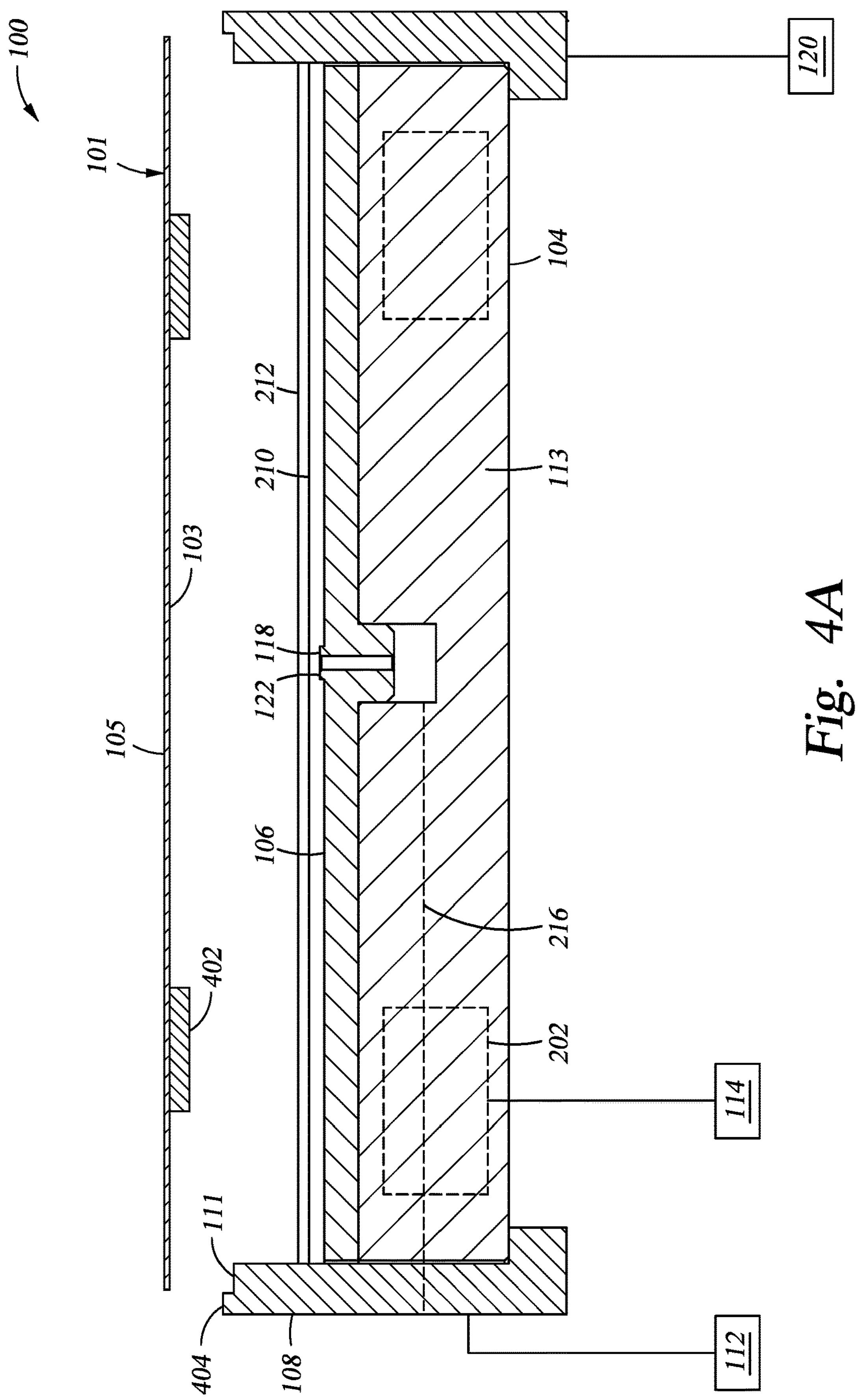
FIGS. 4A-4C are schematic, cross-sectional views of the substrate support assembly during the method according to embodiments.
Figure 4B:
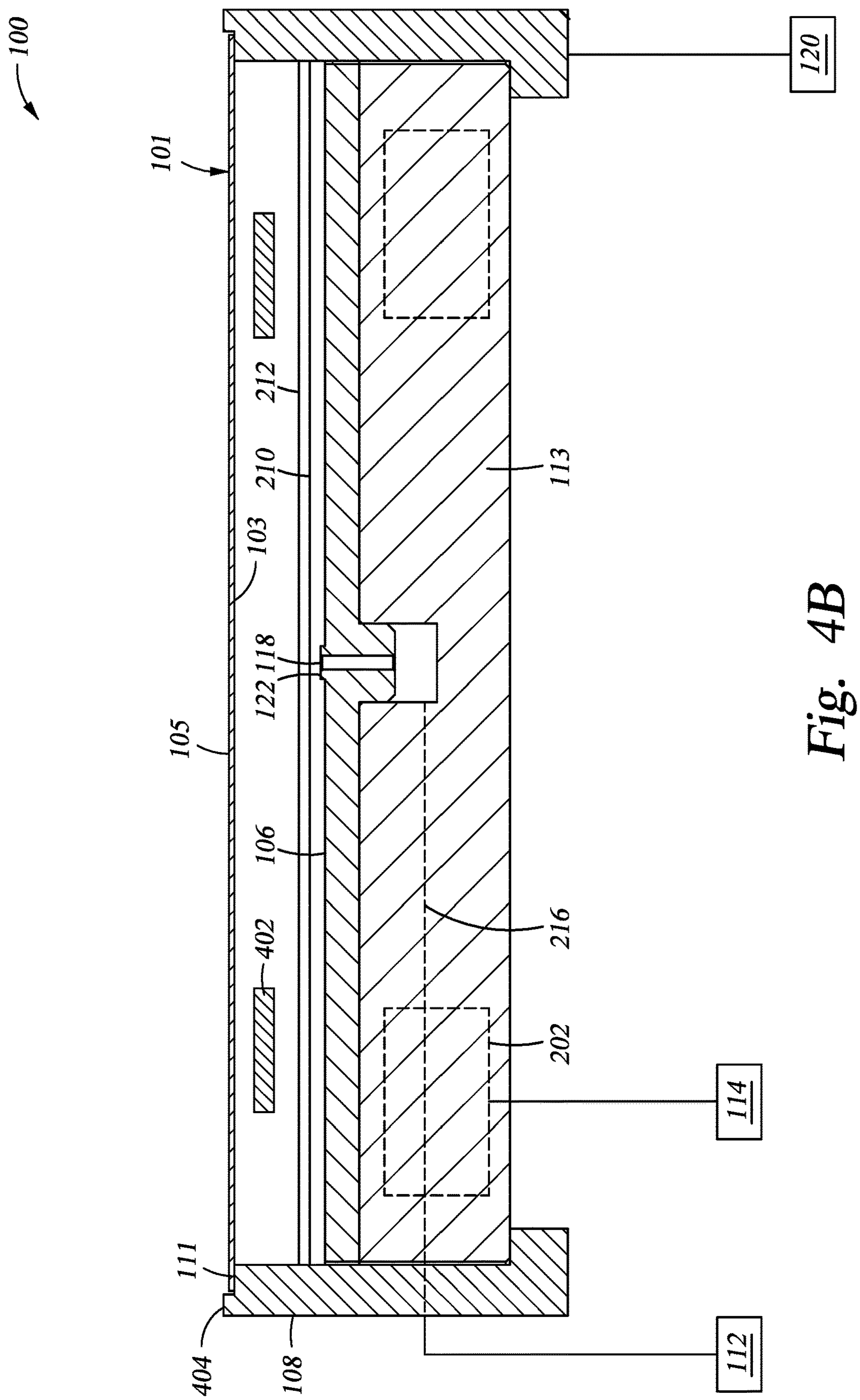
Figure 4C:
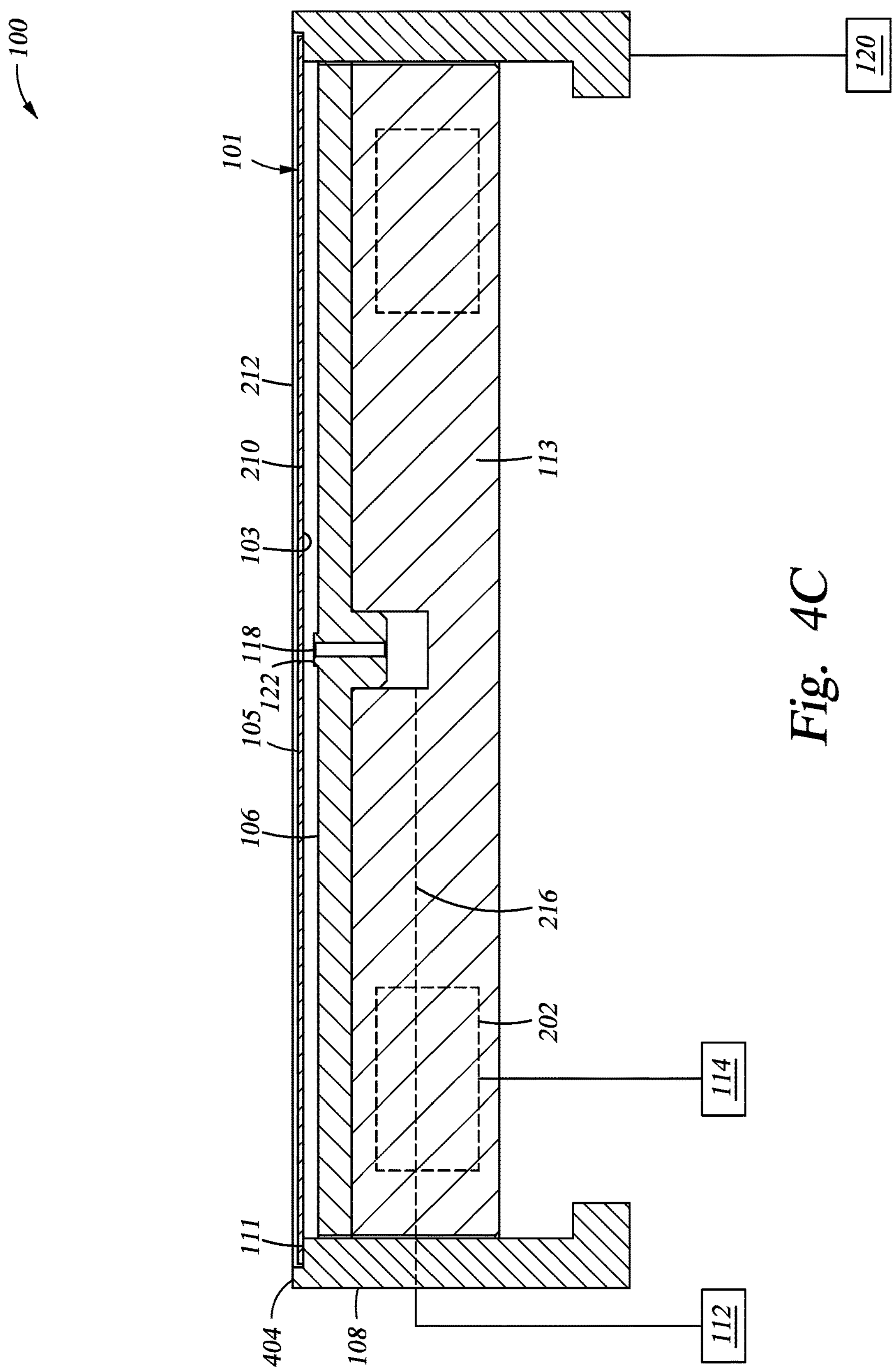

In some embodiments, a seal (not shown) is disposed on each of the extensions 108 to retain the substrate 101. For example, the seal is an O-ring. The extensions 108 in the lowered position (as shown in FIG. 4C) are lowered such that the extensions 108 are in plane with the body 102. Each extension 108 may also include an extension surface 111. The extension surface 111 may correspond to a retention surface 210 (shown in FIG. 2) such that when the extensions 108 are in the lowered position, the extension surface 111 is sufficiently the same as the retention surface 210. For example, the substrate 101 is operable to sit on the extension surface 111 and the retention surface 210. The extension surface, 111 is in plane with the retention surface 210 in the lowered position. The extension surface 111 is configured to support an exclusion zone of a substrate to be retained on the extensions 108.

The body 102 includes a lower plate 104 and an upper plate 106. The upper plate 106 is coupled to the lower plate 104. The lower plate 104 includes an exterior surface 113. In some embodiments, the upper plate 106 is coupled to the lower plate 104 via a plurality of fasteners (not shown) such as bolts or screws disposed through the upper plate 106 and the lower plate 104. The extensions 108 are disposed around a perimeter of the upper plate 106 and the lower plate 104. The upper plate 106 includes a plurality of vacuum slots 110. The plurality of vacuum slots 110 are disposed through the upper plate 106. The plurality of vacuum slots 110 are positioned underneath the substrate 101. The plurality of vacuum slots 110 are in fluid communication with a vacuum source 114.

A gas nozzle 118 is disposed through the upper plate 106. The gas nozzle 118 is in fluid communication with a gas source 112. The gas source 112 may include clean dry air (CDA), helium (He), argon (Ar), nitrogen gas ($N_2$), or combinations thereof. The substrate support assembly 100 further includes a controller 107. The controller 107 is operable to control aspects of the substrate support assembly 100 during processing. A gas is provided through a top surface 122 of the gas nozzle 118.

In one embodiment, which can be combined with other embodiments described herein, the body 102 is formed from a metallic material, such as aluminum, stainless steel, or alloys, combinations, or mixtures thereof. In another embodiment, which can be combined with other embodiments described herein, the body 102 is formed from a ceramic material, such as a silicon nitride material, an aluminum nitride material, an alumina material, or alloys, combinations, or mixtures thereof.

FIG. 2 is a schematic, cross-sectional view of a substrate support assembly 100 in a raised position. The lower plate 104 includes a vacuum channel 202. The vacuum channel 202 is disposed through the lower plate 104. The vacuum channel 202 is disposed around the perimeter of the body 102. The vacuum channel 202 is in fluid communication with a vacuum source 114 via a vacuum line 205. The lower plate 104 further includes a plurality of openings 204. The plurality of openings 204 are disposed through a lower plate top surface 206 of the lower plate 104. The upper plate 106 includes a recess 208. The recess 208 is disposed through the upper plate 106. The recess 208 is disposed around the perimeter of the body 102. The vacuum source 114 provides a vacuum pressure to a plurality of vacuum slots 110. The vacuum pressure is provided to the plurality of vacuum slots 110 from the vacuum source 114 via the vacuum channel 202, the plurality of openings 204 and the recess 208.

The substrate 101 is secured with the vacuum pressure when in a lowered position. The substrate 101 may sit on a retention surface 210 of the upper plate 106. The vacuum source 114 is operable to provide vacuum pressure through the plurality of vacuum slots 110 to secure the substrate 101 to the retention surface 210. The plurality of vacuum slots 110 are formed through the retention surface 210. The retention surface 210 is recessed from an upper surface 212 of the upper plate 106. The retention surface 210 is disposed below the upper surface 212. The upper surface 212 and the retention surface 210 meet to form a lip 214 therebetween. The lip 214 extends between the retention surface 210 and the upper surface 212. As such, the substrate 101 sits on the retention surface 210. The retention surface 210 and the lip 214 are configured to support and define an exclusion zone of the substrate 101 to be retained on the retention surface 210. The exclusion zone of the substrate 101 is supported by the extension surface 111 in the raised position. The exclusion zone of the substrate 101 is supported by the extension surface 111 and the retention surface 210 in the lowered position.

The substrate 101 is retained laterally by the vacuum pressure from the plurality of vacuum slots 110 and the lip 214. A vacuum pressure is provided through the plurality of vacuum slots 110 to sufficiently secure the substrate 101 to the retention surface 210 without shifting along the retention surface 210. The vacuum pressure may be adjusted depending on size and thickness of the substrate 101. The controller 107 is operable to provide instructions and facilitate the actuation of the vacuum source 114 to provide the vacuum pressure to the retention surface 210.

A gas nozzle 118 is disposed through the upper plate 106. The gas nozzle 118 is in fluid communication with a gas source 112 via a gas source line 216. The gas source line 216 is disposed through the lower plate 104. In some embodiments, the gas source line 216 is disposed from the exterior surface 113 of the lower plate 104 to the gas nozzle 118. The gas source line 216 provides gas to the gas nozzle 118. The gas nozzle 118 is positioned to release the gas in a direction perpendicular to the first surface 105 and the second surface 103 of the substrate 101. The gas source 112 may be in communication with the controller 107. The controller 107 is operable to provide instructions and facilitate the delivery of gas through the gas nozzle 118. The controller 107 is operable to adjust a gas pressure of the gas delivered through the gas nozzle 118. When in the lowered position (shown in FIG. 4C), the gas is operable to provide gas pressure to the substrate 101 to control the profile of the substrate 101 without contacting the second surface 103 of the substrate 101. For example, the gas may provide pressure to control a profile of the substrate 101 and reduce contact on the substrate. For example, the gas may be utilized to maintain the substrate 101 substantially planar. The vacuum pressure will also vary according to the gas pressure to ensure the substrate 101 remains contacting the retention surface 210. For example, increasing the gas pressure may require increasing the vacuum pressure accordingly.

Figure 3:
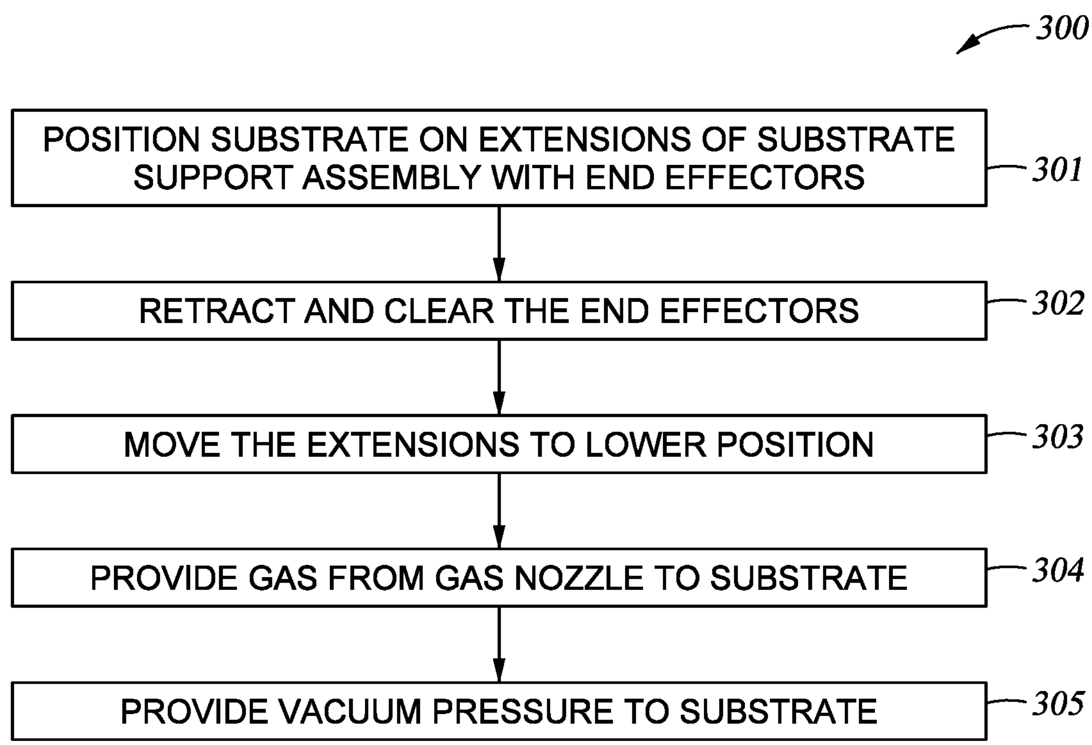
FIG. 3 is a flow diagram of a method for retaining a substrate with a substrate support assembly according to embodiments.

FIG. 3 is a flow diagram of a method 300 for retaining a substrate 101 with a substrate support assembly 100. FIGS. 4A-4C are schematic, cross-sectional views of the substrate support assembly 100 during the method 300. It is to be noted that the method 300 may be utilized in optical device manufacturing systems. For example, the method 300 may be utilized in chemical vapor deposition (CVD) systems, plasma-enhanced CVD (PECVD) systems, nano-imprint lithography systems, spin-on coating systems, angled etch systems, ink-jet systems, among others, as well as other systems utilized in manufacturing optical devices. An end effector 402 is operable to interact with the substrate 101 during the method 300. The end effector 402 is operable to position the substrate 101 on the substrate support assembly 100. The end effector 402 may be coupled to a robot.

The method 300 described herein provides for the retention of the substrate 101 without contacting active areas of the substrate 101. Additionally, the substrate support assembly 100 provides for control of the profile of the substrate. For example, the substrate 101 may be retained substantially planar within +/−0.1 mm. It is undesirable for active areas of the substrate 101 to be handled or touched when retained by the substrate support assembly 100 as a second surface 103 (i.e., bottom surface) opposite a first surface 105 will be patterned with optical devices.

At operation 301, an end effector 402 positions a substrate 101 onto extensions 108 of the substrate support assembly 100. The extensions 108 are in a raised position. The raised position is defined by the extensions 108 being raised above an upper plate 106 of the substrate support assembly 100. In the raised position, an extension top surface 404 of the extensions 108 are not planar with an upper surface 212 of the upper plate 106. The end effector 402 contacts the substrate 101 on exclusion zones of the substrate 101 such that optical devices formed on a second surface 103 are not damaged due to direct contact from the end effectors 402. The substrate 101 is positioned on an extension surface 11 of each of the extensions 108. The extensions 108 contact the exclusion zone of the substrate 101.

In one embodiment, which can be combined with other embodiments described herein, the exclusion zone of a first surface 105 of the substrate 101 is in contact with the extensions 108. The first surface 105 is positioned such that active areas (i.e., portions of the substrate 101 including one or more optical devices or portions of one or more optical devices to be patterned thereon) of the substrate 101 are not contacted. In another embodiment, as shown herein, which can be combined with other embodiments described herein, the exclusion zone of a second surface 103 of the substrate 101 is in contact with the extensions 108. The second surface 103 is positioned such that active areas (i.e., portions of the substrate 101 including one or more optical devices or potions for one or more optical devices to be patterned thereon) of the substrate 101 are not contacted.

At operation 302, as shown in FIG. 4B, the end effectors 402 are retracted and cleared from the substrate support assembly 100. At operation 303, as shown in FIG. 4C, the extensions are moved to a lowered position. The lowered position is defined by the extension top surface 404 of the extensions 108 being planar with the upper surface 212 of the upper plate 106. The extensions 108 lower such that the substrate 101 will sit on the upper plate 106 (e.g., on a retention surface 210, shown in FIG. 2). A plurality of vacuum slots 110 (shown in FIGS. 1 and 2) are disposed through the retention surface of the upper plate 106.

At operation 304, a gas is provided from a gas nozzle 118. The gas nozzle 118 is positioned such that the gas is projected to the second surface 103 of the substrate 101. The gas is provided from a gas source 112 in communication with the gas nozzle 118. The controller 107 is operable to actuate the gas source 112 and to instruct the gas source 112 to increase and decrease a gas pressure of the gas, as desired. Therefore, the pressure applied to the substrate 101 may be static (i.e., constant gas pressure) or dynamic (i.e., gas pressure varies over time). In some embodiments, which can be combined with other embodiments described herein, the gas may be provided through the gas nozzle 118 prior to the operation 304. For example, the gas may be provided concurrently as the substrate 101 is being lowered to the upper plate 106. In other embodiments, which can be combined with other embodiments described herein, the operation 304 may be performed after the operation 305. The gas may be provided when the extensions 108 are in the raised position or the lowered position.

The gas nozzle 118 does not contact the either the first surface 105 or the second surface 103 of the substrate 101. As such, a top surface 122 of the gas nozzle 118 is below both the first surface 105 and the second surface 103 of the substrate 101. The top surface 122 of the gas nozzle is also positioned below the retention surface to allow for a space between the top surface 122 and the substrate 101 on the retention surface 210. The gas is provided from the gas nozzle 118 to contact the substrate 101 and control the profile of the substrate 101. For example, gravitational forces can induce profile changes on the substrate 101 and the gas pressure may be utilized to counter the profile changes. The gas is operable to apply gas pressure to either the first surface 105 or the second surface 103 without contacting the active areas of the substrate 101. Therefore, the substrate 101 may be flat or substantially flat.

At operation 305, a vacuum pressure is provided to the substrate 101. The vacuum pressure is provided from a vacuum source 114 in communication with the plurality of vacuum slots 110 (shown in FIG. 2). The substrate 101 is positioned on the retention surface 210 and the vacuum pressure is activated to retain the substrate 101 on the upper plate 106. The vacuum pressure prevents lateral movement of the substrate 101. The vacuum pressure prevents rotation of the substrate 101. The vacuum pressure counters the pressure provided from the gas nozzle 118 to chuck the substrate 101 to the substrate support assembly 100. Therefore, the substrate maintains orientation and positon for processing. Maintaining the orientation and position improves the accuracy and quality during processing operations.

The combination of the gas from the gas source 112 provided to the substrate 101 and the vacuum pressure applied from the vacuum source 114 allows for the substrate to control the profile of the substrate 101 such that the substrate 101 is substantially planar, within +/−0.1 mm. The controller 107, in communication with the gas source 112 and the vacuum source 114, can facilitate adjustments of gas pressure and vacuum pressure applied to the substrate 101. The adjustments may be dynamic (i.e., gas pressure changes over time). The substrate support assembly 100 allows for retention of the substrate 101. The substrate 101 is ready for processing of the first surface 105 and/or the second surface 103.

In summation, substrate support assemblies for retaining a surface of a substrate and controlling a profile of the substrate are described herein. The substrate support assembly described herein provides for the retention of a substrate without contacting the one or more devices formed on a first surface or a second surface of the substrate. Additionally, the substrate support assembly compensates for changes in profile of the substrate. Gas is provided to a surface of the substrate to ensure the substrate is substantially planar. The gas nozzle does not contact active areas of the substrate while maintaining the desired profile of the substrate with pressure from the gas. A vacuum pressure is provided around the perimeter of the substrate to prevent lateral movement and rotation. The vacuum pressure also ensures the substrate remains chucked to the substrate support assembly.

While the foregoing is directed to examples of the present disclosure, other and further examples of the disclosure may be devised without departing from the basic scope thereof, and the scope thereof is determined by the claims that follow.

What is claimed is:

1. A substrate support assembly, comprising:

a lower plate;

an upper plate coupled to the lower plate, the upper plate disposed on a top surface of the lower plate, the upper plate having:

an upper surface;

a retention surface disposed below the upper surface;

a lip formed between the upper surface and the retention surface; and a plurality of vacuum slots disposed through the retention surface;

at least two arcuate extensions disposed at a perimeter of the lower plate and the upper plate, the extensions operable to move into a raised position and a lowered position;

an end effector operable to position a substrate having a first surface and a second surface opposite the first surface onto the extensions disposed in the raised position, wherein the end effector is in direct contact with an exclusion zone on the second surface; and a gas nozzle disposed through the upper plate and operable to provide a gas to active areas of the second surface of the substrate at a direction perpendicular to the second surface of the substrate, wherein the plurality of vacuum slots are operable to provide a vacuum pressure to the exclusion zone of the substrate.

2. The substrate support assembly of claim 1, further comprising a vacuum channel disposed through the lower plate, the vacuum channel disposed along a perimeter of the lower plate.

3. The substrate support assembly of claim 2, further comprising a plurality of openings through the top surface of the lower plate.

4. The substrate support assembly of claim 3, further comprising a recess disposed through the upper plate, the recess disposed along a perimeter of the upper plate.

5. The substrate support assembly of claim 4, further comprising a vacuum source in fluid communication with the vacuum channel via a vacuum line.

6. The substrate support assembly of claim 1, further comprising a gas source in fluid communication with the gas nozzle via a gas source line.

7. The substrate support assembly of claim 6, further comprising a controller in communication with the gas source, the controller operable to instruct the gas source to adjust a pressure of gas provided through the gas nozzle.

8. The substrate support assembly of claim 1, wherein the upper plate and the lower plate are formed from aluminum, stainless steel, or alloys, combinations, or mixtures thereof.

9. The substrate support assembly of claim 1, wherein the upper plate and the lower plate are formed from a silicon nitride material, an aluminum nitride material, an alumina material, or alloys, combinations, or mixtures thereof.

10. A substrate support assembly, comprising:

a lower plate;

an upper plate coupled to the lower plate, the upper plate disposed on a top surface of the lower plate, the upper plate having:

an upper surface;

a retention surface disposed below the upper surface;

a lip formed between the upper surface and the retention surface; and a plurality of vacuum slots disposed through the retention surface;

at least two extensions disposed at a perimeter of the lower plate and the upper plate, the extensions operable to move into a raised position and a lowered position;

an end effector operable to position a substrate having a first surface and a second surface opposite the first surface onto the extensions disposed in the raised position, wherein the end effector is in direct contact with an exclusion zone on the second surface; and a gas nozzle disposed through the upper plate and operable to provide a gas to active areas of the second surface of the substrate at a direction perpendicular to the second surface of the substrate, wherein a top surface of the gas nozzle is disposed below the retention surface, wherein the plurality of vacuum slots are operable to provide a vacuum pressure to the exclusion zone of the substrate.

11. The substrate support assembly of claim 10, further comprising a gas source in fluid communication with the gas nozzle via a gas source line.

12. The substrate support assembly of claim 11, further comprising a controller in communication with the gas source, the controller operable to instruct the gas source to adjust a pressure of gas provided through the gas nozzle.

13. The substrate support assembly of claim 10, wherein the upper plate and the lower plate are formed from aluminum, stainless steel, or alloys, combinations, and mixtures thereof.

14. The substrate support assembly of claim 10, wherein the upper plate and the lower plate are formed from a silicon nitride material, an aluminum nitride material, an alumina material, or combinations and mixtures thereof.

15. A method, comprising:

positioning a substrate having a first surface and a second surface opposite the first surface onto at least two extensions disposed in a raised position of a substrate support assembly, by an end effector in direct contact with an exclusion zone on the second surface, the extensions coupled to a body of the substrate support assembly;

lowering the extensions to a lowered position, wherein in the lowered position the second surface of the substrate is in contact with an extension surface of each of the extensions that is in plane with a retention surface of the body, the retention surface including a plurality of vacuum slots disposed therethrough;

providing a gas to active areas of the second surface of the substrate through a gas nozzle disposed through the body of the substrate support assembly, the gas nozzle providing the gas at a direction perpendicular to the second surface of the substrate; and providing a vacuum pressure to the exclusion zone of the substrate, the vacuum pressure provided through the plurality of vacuum slots.

16. The method of claim 15, wherein the gas is clean dry air (CDA), helium (He), argon (Ar), nitrogen gas ($N_2$), or combinations thereof.

17. The method of claim 15, further comprising providing the gas to the second surface the substrate when the substrate support assembly is in the raised position.

18. The method of claim 15, further comprising providing the gas to the second surface of the substrate when the substrate support assembly is in the lowered position.

19. The method of claim 15, further comprising:

subsequent to positioning the substrate and prior to lowering the extensions, retracting the end effector and clearing the end effector from the substrate support assembly.

20. The method of claim 15, wherein:

in the raised position, the extensions are raised above an upper plate of the substrate support assembly and an extension top surface of the extensions are not coplanar with an upper surface of the upper plate, and in the lowered position, the extension top surface of the extensions is coplanar with the upper surface of the upper plate.

* * * * *